(12) United States Patent
Park et al.

(10) Patent No.: US 8,416,177 B2
(45) Date of Patent: Apr. 9, 2013

(54) LIGHT EMISSION CONTROL DRIVER, LIGHT EMITTING DISPLAY DEVICE USING THE SAME, AND METHOD FOR DRIVING LIGHT EMISSION CONTROL SIGNAL

(75) Inventors: Dong-Wook Park, Yongin (KR); Kyung-Hoon Chung, Yongin (KR)

(73) Assignee: Samsung Display Co., Ltd., Yongin, Gyeeonggi-do (KR)

( * ) Notice: Subject to any disclaimer, the term of this patent is extended or adjusted under 35 U.S.C. 154(b) by 268 days.

(21) Appl. No.: 12/929,227

(22) Filed: Jan. 10, 2011

(65) Prior Publication Data

US 2011/0285752 A1 Nov. 24, 2011

(30) Foreign Application Priority Data

May 20, 2010 (KR) .................... 10-2010-0047715

(51) Int. Cl.
*G09G 3/36* (2006.01)

(52) U.S. Cl.
USPC .......................... 345/100; 345/80; 345/690

(58) Field of Classification Search .............. 345/80, 345/98, 100, 204, 690
See application file for complete search history.

(56) References Cited

U.S. PATENT DOCUMENTS

| | | | |
|---|---|---|---|
| 2009/0262051 A1* | 10/2009 | Kim et al. | 345/80 |
| 2012/0038609 A1* | 2/2012 | Chung | 345/211 |

FOREIGN PATENT DOCUMENTS

| | | | |
|---|---|---|---|
| KR | 10 2006-0019872 A | 3/2006 |
| KR | 10 2006-0080636 A | 7/2006 |
| KR | 10-0646992 B1 | 11/2006 |
| KR | 10-0685842 B1 | 2/2007 |
| KR | 10-2008-0020353 A | 3/2008 |
| KR | 10-2008-0020354 A | 3/2008 |
| KR | 10-2008-0062458 A | 7/2008 |

* cited by examiner

*Primary Examiner* — Amare Mengistu
*Assistant Examiner* — Premal Patel
(74) *Attorney, Agent, or Firm* — Lee & Morse, P.C.

(57) ABSTRACT

A light emission control driver includes a first logic unit configured to receive a plurality of clock signals and a first input signal and generate a first output signal; a second logic unit configured to receive a plurality of clock signals and a second input signal and generate a second output signal; and an output controller configured to receive the first output signal, the second output signal, a first control signal, and a second control signal, and generate a light emission control signal. When a driving scheme of a display unit is a simultaneous light emission mode, the light emission control signal is controlled according to driving of the output controller, and, when the driving scheme of the display unit is a progressive light emission mode, the light emission control signal is controlled according to driving of the first logic unit, the second logic unit, and the output controller.

36 Claims, 9 Drawing Sheets

LIGHT EMISSION CONTROL DRIVER, LIGHT EMITTING DISPLAY DEVICE USING THE SAME, AND METHOD FOR DRIVING LIGHT EMISSION CONTROL SIGNAL

BACKGROUND

1. Field

Embodiments relate to a light emission control driver, a light emitting display device using the same, and a method for driving a light emission control signal.

2. Description of the Related Art

Various flat panel displays having reduced weight and volume (drawbacks of cathode ray tubes (CRTs)), have been developed. Flat panel displays include, e.g., a liquid crystal display (LCD), a field emission display (FED), a plasma display panel (PDP), an organic light emitting diode (OLED) display, and the like.

An OLED display may display an image by using an OLED that generates light by a recombination of electrons and holes. The OLED display may exhibit a fast response speed, may be driven with low power consumption, and may have excellent luminous efficiency, luminance, and viewing angle, such that it has been spotlighted.

In a flat panel display, a plurality of pixels may be are disposed in a matrix on a substrate to form a display panel, and scan lines and data lines may be connected to the respective pixels to selectively transmit data signals to the pixels to perform display.

In general, an OLED display may be a passive matrix OLED (PMOLED) display or an active matrix OLED (AMOLED) display depending on how OLEDs are driven. In the AMOLED display, OLEDs may be selectively driven at every unit pixel. The AMOLED display is becoming the mainstream due to improvements of resolution, contrast, and operation speed.

The above information disclosed in this Background section is only for enhancement of understanding of the background of the invention and therefore it may contain information that does not form the prior art that is already known in this country to a person of skill in the art.

SUMMARY

An example embodiment provides a light emission control driver, including a first logic unit configured to receive a plurality of clock signals and a first input signal and generate a first output signal; a second logic unit configured to receive a plurality of clock signals and a second input signal and generate a second output signal; and an output controller configured to receive the first output signal, the second output signal, a first control signal, and a second control signal, and generate a light emission control signal. When a driving scheme of a display unit is a simultaneous light emission mode, the light emission control signal may be controlled according to driving of the output controller, and, when the driving scheme of the display unit is a progressive light emission mode, the light emission control signal may be controlled according to driving of the first logic unit, the second logic unit, and the output controller.

When the driving scheme of the display unit is the simultaneous light emission mode, the first input signal and the second input signal may be delivered with a gate OFF voltage level, respectively, so the first and second logic units do not operate.

When the driving scheme of the display unit is the simultaneous light emission mode, a pulse width of the light emission control signal may be determined by a time difference between time points at which the first control signal and the second control signal are delivered with the pulse of a gate ON voltage level, respectively.

The pulse width of the light emission control signal may be equal to a light emission period or a non-light emission period of the display unit.

A delivery time of the pulse of the gate ON voltage level of the first control signal may be the same as, or more than at least one horizontal period (1H) later than, a delivery time of the pulse of the gate OFF voltage level of the second control signal.

A delivery time of a pulse of a gate OFF voltage level of the first control signal may be the same as, or more than at least one horizontal period (1H) earlier than, a delivery time of the pulse of the gate ON voltage level of the second control signal.

A duration of time in which the voltage levels of the first and second control signals change may be more than at least one horizontal period (1H).

When the driving scheme of the display unit is the progressive light emission mode, a pulse width of the light emission signal may be determined by a time difference between a time point at which the first input signal is delivered with a pulse of a gate ON voltage level to the first logic unit and a time point at which the second input signal is delivered with the pulse of the gate ON voltage level to the second logic unit.

The pulse width of the light emission control signal may be equal to a light emission period or a non-light emission period of the display unit.

A time point at which a phase of the light emission signal is changed to a gate OFF voltage level may be synchronized with a time point at which a low level pulse of a clock signal is delivered to the first logic unit when the first input signal is delivered with the pulse of the gate ON voltage level, and a time point at which the phase of the light emission signal is changed to a gate ON voltage level may be synchronized with a time point at which a low level pulse of a clock signal is delivered to the second logic unit when the second input signal is delivered with the pulse of the gate ON voltage level.

The first logic unit may include a first switch, a switching operation of which is controlled by a first clock signal among the plurality of clock signals, the first switch delivering a voltage according to the voltage level of the first input signal to a first node; a second switch, a switching operation of which is controlled by the first input signal, the second switch delivering a first power source voltage to a second node; a third switch, a switching operation of which is controlled corresponding to the voltage that has been delivered to the first node, the third switch delivering a voltage according to a voltage level of a second clock signal among the plurality of signals, with the voltage level of the first output signal; a fourth switch, a switching operation of which is controlled corresponding to the voltage that has been delivered to the second node, the fourth switch delivering the first power source voltage with the voltage level of the first output signal; a first capacitor storing the voltage that has been delivered to the first node; and a second capacitor storing the voltage that has been delivered to the second node.

The first logic unit may further include a fifth switch, a switching operation of which is controlled by a third clock signal among the plurality of clock signals, the fifth switch delivering a second power source voltage having a lower level than that of the first power source voltage to the second node; and at least one sixth switch, a switching operation of which is controlled by the second power source voltage that has been delivered to the second node, the at least one sixth switch delivering the first power source voltage to the first node.

The second logic may include a seventh switch, a switching operation of which is controlled by a third clock signal among the plurality of clock signals, the seventh switch delivering a voltage according to the voltage level of the second input signal to a third node; an eighth switch, a switching operation of which is controlled by the second input signal, the eighth switch delivering a first power source voltage to a fourth node; a ninth switch, a switching operation of which is controlled corresponding to the voltage that has been delivered to the third node, the ninth switch delivering a voltage according to a voltage level of the first clock signal among the plurality of clock signals, with the voltage level of the second output signal; a tenth switch, a switching operation of which is controlled corresponding to the voltage that has been delivered to the fourth node, the tenth switch delivering the first power source voltage with the voltage level of the second output signal; a third capacitor storing the voltage that has been delivered to the third node; and a fourth capacitor storing the voltage that has been delivered to the fourth node.

The second logic unit may further include at least one eleventh switch, a switching operation of which is controlled by the second clock signal among the plurality of clock signals, the at least one eleventh switch delivering a second power source voltage having a lower level than that of the first power source voltage to the fourth node; and at least one twelfth switch, a switching operation of which is controlled by the second power source voltage that has been delivered to the fourth node, the at least one twelfth switch delivering the first power source voltage to the third node.

The output controller may include at least one thirteenth switch, a switching operation of which is controlled by the first output signal, the at least one thirteenth switch delivering the first power source voltage to a fifth node; at least one fourteenth switch, a switching operation of which is controlled by the first output signal, the at least one fourteenth switch delivering a second power source voltage having a lower level than that of the first power source voltage to a sixth node; at least one fifteenth switch, a switching operation of which is controlled by the second output signal, the at least one fifteenth switch delivering the second power source voltage to the fifth node; at least one sixteenth switch, a switching operation of which is controlled by the first control signal, the at least one sixteenth switch delivering the first power source voltage to the fifth node; at least one seventeenth switch, a switching operation of which is controlled by the first control signal, the at least one seventeenth switch delivering the second power source voltage to the sixth node; at least one eighteenth switch, a switching operation of which is controlled by the second control signal, the at least one eighteenth switch delivering the first power source voltage to the sixth node; at least one nineteenth switch, a switching operation of which is controlled by the second control signal, the at least one nineteenth switch delivering the second power source voltage to the fifth node; a twentieth switch, a switching operation of which is controlled by the voltage that has been delivered to the fifth node, the twentieth switch delivering the first power source voltage to the sixth node; a twenty-first switch, a switching operation of which is controlled by the voltage that has been delivered to the sixth node, the twenty-first switch delivering the first power source voltage with a voltage level of the light emission control signal; a twenty-second switch, a switching operation of which is controlled by the voltage that has been delivered to the fifth node, the twenty-second switch delivering the second power source voltage with the voltage level of the light emission control signal; a fifth capacitor storing the voltage that has been delivered to the fifth node; and a sixth capacitor storing the voltage that has been delivered to the sixth node.

The first logic unit and second logic unit may further receive a start signal.

Circuit elements constituting the first logic unit, the second logic unit, and the output controller may include a plurality of transistors, and the plurality of transistors may be implemented as only PMOS transistors or only NMOS transistors.

Another example embodiment provides a light emitting display device, including a display unit including a plurality of pixels connected to a plurality of scan lines delivering a plurality of scan signals, a plurality of data lines delivering a plurality of data signals, and a plurality of light emission control lines delivering a plurality of light emission control signals; a scan driver generating a scan signal and delivering the generated scan signal to a corresponding scan line among the plurality of scan lines; a data driver delivering data signals to the plurality of data lines; and a light emission control driver generating a light emission control signal and delivering the generated light emission control signal to a corresponding light emission control line among the plurality of light emission control lines. The light emission control driver may include a first logic unit configured to receive a plurality of clock signals and a first input signal and generate a first output signal; a second logic unit configured to receive a plurality of clock signals and a second input signal and generate a second output signal; and an output controller configured to receive the first output signal, the second output signal, a first control signal, and a second control signal, and generate a light emission control signal. When a driving scheme of a display unit may be a simultaneous light emission mode, the light emission control signal is controlled according to driving of the output controller, and, when the driving scheme of the display unit is a progressive light emission mode, the light emission control signal may be controlled according to driving of the first logic unit, the second logic unit, and the output controller.

When the driving scheme of the display unit is the simultaneous light emission mode, the first input signal and the second input signal may be delivered with a gate OFF voltage level, respectively, so the first and second logic units do not operate.

When the driving scheme of the display unit is the simultaneous light emission mode, a pulse width of the light emission control signal may be determined by a time difference between time points at which the first control signal and the second control signal are delivered with the pulse of a gate ON voltage level, respectively.

The pulse width of the light emission control signal may be equal to a light emission period or a non-light emission period of the display unit.

A delivery time of the pulse of the gate ON voltage level of the first control signal may be the same as, or more than at least one horizontal period (1H) later than, a delivery time of the pulse of the gate OFF voltage level of the second control signal.

A delivery time of a pulse of a gate OFF voltage level of the first control signal may be the same as, or more than at least one horizontal period (1H) earlier than, a delivery time of the pulse of the gate ON voltage level of the second control signal.

A duration of time in which the voltage levels of the first and second control signals change may be more than at least one horizontal period (1H).

When the driving scheme of the display unit is the progressive light emission mode, a pulse width of the light emission signal may be determined by a time difference between a time point at which the first input signal is delivered with a pulse of a gate ON voltage level to the first logic unit and a time point at which the second input signal is delivered with the pulse of the gate ON voltage level to the second logic unit.

The pulse width of the light emission control signal may be equal to a light emission period or a non-light emission period of the display unit.

A time point at which the phase of the light emission signal is changed to a gate OFF voltage level may be synchronized with a time point at which a low level pulse of a clock signal is delivered to the first logic unit when the first input signal is delivered with the pulse of the gate ON voltage level, and a time point at which the phase of the light emission signal is changed to the gate ON voltage level may be synchronized with a time point at which a low level pulse of a clock signal is delivered to the second logic unit when the second input signal is delivered with the pulse of the gate ON voltage level.

The light emission control driver may include a plurality of light emission control circuits each including the first logic unit, the second logic unit, and the output controller, and each of the light emission control circuit may generate an output signal and deliver the generated output signal to each of the plurality of light emission control lines.

The first input signal and second input signal delivered to a light emission control circuit positioned at a predetermined stage among the plurality of light emission control circuits may be the first output signal and second output signal output from a light emission control circuit positioned at a stage previous to the predetermined stage.

The first logic unit and second logic unit may include three clock signal terminals, to each of which a clock signal selected from among three clock signals is input, and a delivery pattern of the three clock signals delivered to the three clock signal terminals of each of the plurality of light emission control circuits may be repeated at every three light emission control circuits sequentially positioned at the plurality of light emission control circuits.

Another example embodiment provides a method for driving a light emission control signal of a light emission control driver that includes a first logic unit configured to receive a plurality of clock signals and a first input signal and generate a first output signal, a second logic unit configured to receive a plurality of clock signals and a second input signal and generate a second output signal, and an output controller configured to receive the first output signal, the second output signal, a first control signal, and a second control signal, and generate a plurality of light emission control signals to be delivered to a plurality of light emission control lines connected to a plurality of pixel rows of a display unit, the method including delivering the first input signal and second input signal with a gate OFF voltage level and delivering the plurality of clock signals with a gate ON voltage level so as to turn off the first logic unit and second logic unit; and delivering the first control signal with the a ON voltage level while the first logic unit and second logic unit are in an OFF state, and simultaneously outputting the plurality of light emission control signals with a gate OFF voltage level during a first period between a first time point at which the first control signal is delivered with the gate ON voltage level and the second control signal is delivered with a gate OFF voltage level, and a second time point at which the first control signal is delivered with a gate OFF voltage level and the second control signal is delivered with a gate ON voltage level.

In a case where the first control signal is delivered with the gate ON voltage level after the second control signal is delivered with the gate OFF voltage level, the first time point may be the delivery time point of the first control signal.

In a case where the second control signal is delivered with the gate ON voltage level after the first control signal is delivered with the gate OFF voltage level, the second time point may be the delivery time point of the second control signal.

The method may further include, while the first and second logic units are in an ON state as the first input signal and second input signal have been delivered with a gate ON voltage level, outputting one of the plurality of light emission control signals with the gate OFF voltage level during a second period between a third time point at which the first input signal is delivered with a gate ON voltage level and a first clock signal among the plurality of clock signals is delivered with the gate ON voltage level, and a fourth time point at which the second input signal is delivered with the gate ON voltage level and a second clock signal among the plurality of clock signals is delivered with the gate ON voltage level. Each of the plurality of light emission control signals with the gate OFF voltage level during the second period may progressively shift by more than at least one horizontal period.

The first control signal and second control signal delivered to the output controller while the first logic unit and second logic unit are in an ON state may have the gate OFF voltage level.

When a circuit element constituting the light emitting display device is a PMOS transistor, the gate ON voltage may be a low level voltage and the gate OFF voltage may be a high level voltage.

BRIEF DESCRIPTION OF THE DRAWINGS

The above and other features and advantages will become more apparent to those of skill in the art by describing in detail example embodiments with reference to the attached drawings, in which.

DETAILED DESCRIPTION

Figure 1:
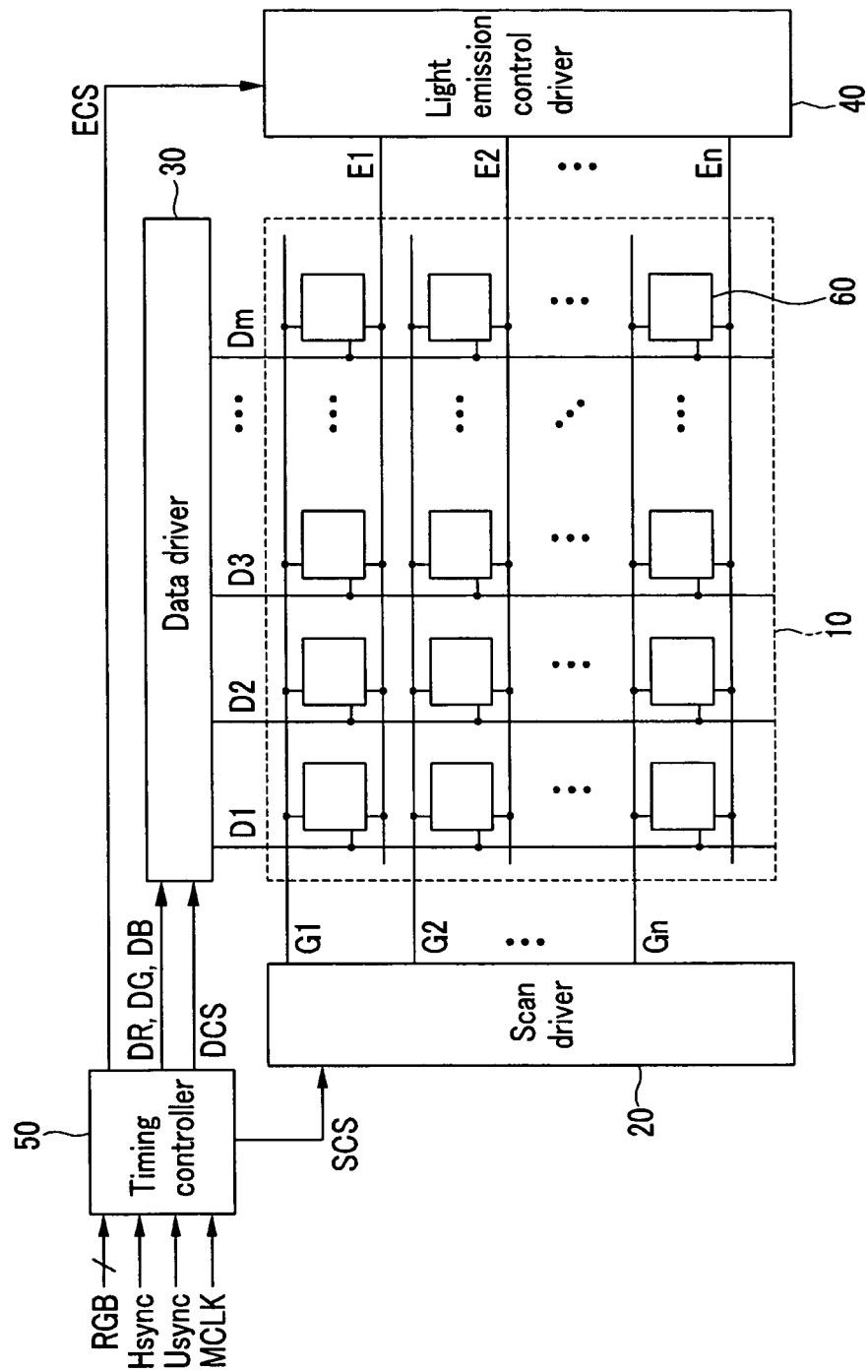
FIG. 1 illustrates a schematic block diagram of a light emitting display device according to an example embodiment.

Korean Patent Application No. 10-2010-0047715, filed on May 20, 2010, in the Korean Intellectual Property Office, and entitled: "Light Emission Control Driver, Light Emitting Display Device Using the Same, and Method for Driving Light Emission Control Signal," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising" will be understood to imply the inclusion of stated elements but not the exclusion of other elements.

FIG. 1 illustrates a schematic block diagram of a light emitting display device according to an example embodiment.

In FIG. 1, the light emitting display device includes a display unit 10, a scan driver 20, a data driver 30, a light emission control driver 40, and a timing controller 50.

In FIG. 1, the display unit 10 includes a plurality of pixels 60, each connected to a corresponding scan line among a plurality of scan lines G1 to Gn, a corresponding light emission control line among a plurality of light emission control lines E1 to En, and a corresponding data line among a plurality of data lines D1 to Dm, at each area where the plurality of scan lines G1 to Gn, the plurality of light emission control lines E1 to En, and the plurality of data lines D1 to Dm cross each other, respectively.

In FIG. 1, the display unit 10 includes the plurality of pixels 60 arranged substantially in a matrix form. In the matrix form of the pixels 60, the plurality of scan lines delivering scan signals and the plurality of light emission control lines delivering light emission control signals extend substantially in a row direction and are substantially parallel to each other, and the plurality of data lines extend substantially in a column direction and are substantially parallel to each other, but arrangements are not necessarily limited thereto.

Each pixel 60 may include a driving transistor and an organic light emitting diode (OLED). The pixel 60 may be selected from among a plurality of pixels included in the display unit 10 by a scan signal delivered through a corresponding scan line among the plurality of scan lines G1 to Gn. The driving transistor included in the pixel 60 may receive a data voltage according to a data signal delivered through a corresponding data line among the plurality of data lines D1 to Dm and supply current according to the data voltage to the OLED to allow the OLED to emit light of a certain luminance.

The light emission of the OLED of the pixel 60 may be adjusted as the flowing of the current to the OLED is controlled by a light emission control signal delivered through a corresponding light emission control signal among the plurality of light emission control signals E1 to En.

In FIG. 1, the scan driver 20 is connected to the plurality of scan lines G1 to Gn and generates a scan signal. The scan driver 20 may deliver a scan signal to each of the plurality of scan lines G1 to Gn, respectively. A certain row of a plurality of pixel rows of the display unit 10 may be selected by the scan signal, and data signals may be delivered through the data lines connected to the plurality of pixels positioned at the selected pixel row.

In FIG. 1, the data driver 30 is connected to the plurality of data lines D1 to Dm. The data driver 30 may generate data signals and sequentially deliver them to the plurality of pixels included in one of the plurality of pixel rows of the display unit 10 through the plurality of data lines D1 to Dm, respectively, In FIG. 1, the light emission control driver 40 is connected to the plurality of light emission control lines E1 to En. The light emission control driver 40 may generate light emission control signals and deliver them to the plurality of light emission control lines E1 to En, respectively. The light emission control driver 40 may adjust a pulse width of the light emission control signal according to a light emission drive control signal delivered from the timing controller 50. Also, the light emission control driver 40 may adjust pulse voltage levels of the respective light emission control signals delivered to the plurality of pixels included in the plurality of pixel rows such that they are all equal, or may adjust the pulse voltage levels such that they are sequentially changed by the rows, thereby controlling such that a light emission scheme of the display unit 10 is implemented variably in a simultaneous light emission mode or a progressive light emission mode as necessary.

Upon receiving the light emission control signal, the pixel 60, connected to the light emission control lines E1 to En, may determine a time point at which current generated in the pixel 60 flows to the OLED. In this case, the light emission control driver 40 may be implemented as a PMOS transistor or an NMOS transistor. When the display unit 10 is formed, the light emission control driver 40 may be formed on a substrate or may be formed in the form of a chip at an outer side, without performing additional process.

The timing controller 50 may generate driving control signals for controlling driving of the scan driver 20, the data driver 30, and the light emission control driver 40 by using a horizontal synchronization signal Hsync, a vertical synchronization signal Vsync, and a clock signal MCLK input from the exterior. Thus, a data driving control signal DCS generated by the timing controller 50 may be supplied to the data driver 30, and a scan driving control signal SCS generated by the timing controller 50 may be supplied to the scan driver 20. Also, the timing controller 50 may supply a light emission driving control signal ECS in order to control an output waveform of the light emission control signal generated by the light emission control driver 40.

Figure 2:
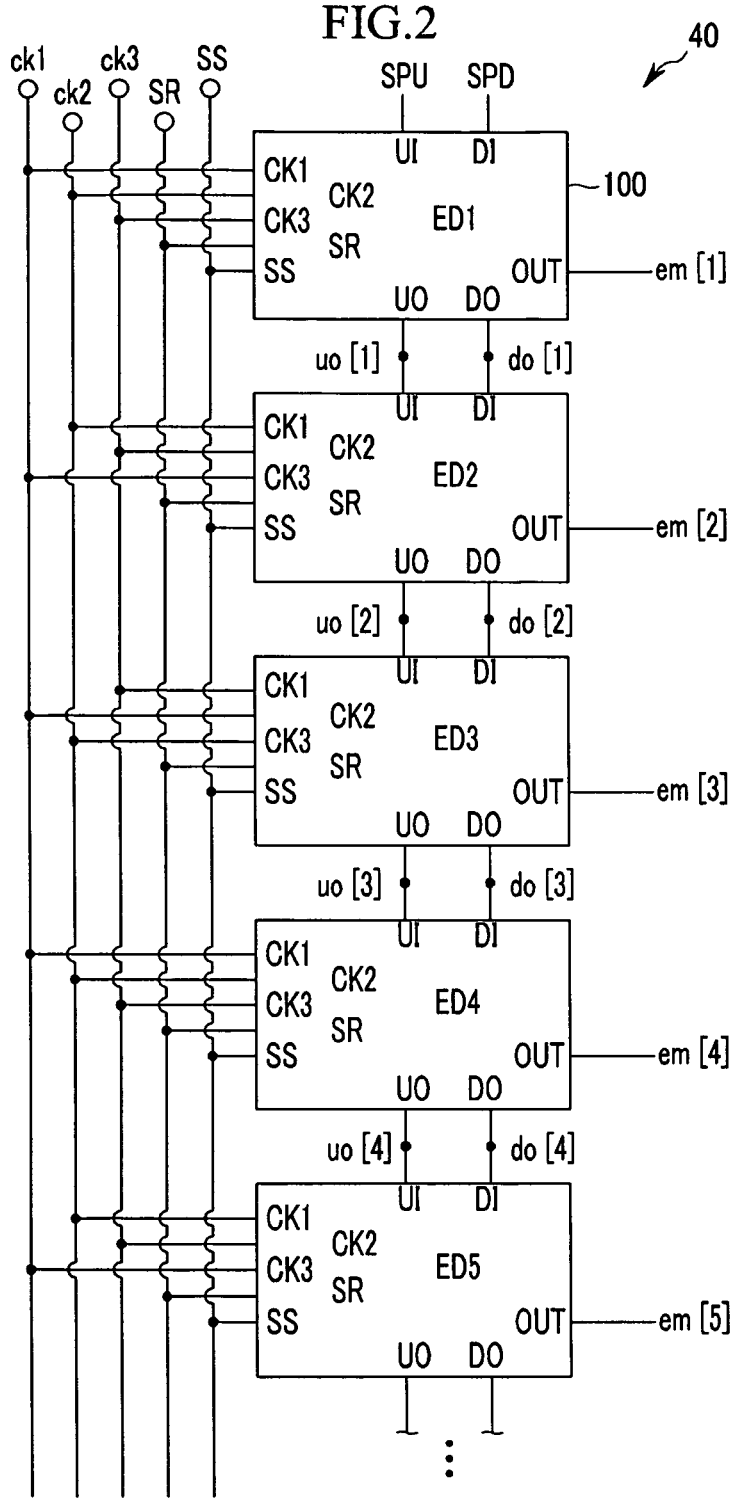
FIG. 2 illustrates a schematic block diagram showing an example of a light emission control driver illustrated in FIG. 1.

FIG. 2 illustrates a schematic block diagram showing an example of the light emission control driver 40 illustrated in FIG. 1.

The light emission control driver 40 may include a number n of light emission control circuits ED1 to EDn in order to generate a plurality of light emission control signals em[1] to em[n] and deliver them to the n number of light emission control lines E1 to En. Preferably, the n number of light emission control circuits ED1 to EDn may be sequentially arranged by rows such that they are connected to the light emission control lines E1 to En connected to the plurality of pixel rows of the display unit 10 and deliver the light emission control signals em[1] to em[n], respectively.

The light emission control circuits ED1 to EDn may be driven upon receiving driving control signals from seven input terminals, respectively. For example, the light emission control circuits ED1 to EDn may be driven upon receiving three clock signals ck1, ck2, and ck3 delivered to three clock signal terminals CK1, CK2, and CK3, and four control signals SR, SS, SPU, and SPD delivered to four input signal terminals SR, SS, UI, and DI. However, this is merely an example, and the light emission control circuits ED1 to EDn may be variably driven by using a plurality of input signal terminals and clock signal terminals.

In detail, with reference to FIG. 2, the timing controller 50 may generate the three clock signals and deliver them to the three clock signal terminals CK1, CK2, and CK3 included in the light emission control circuit 100 of each stage of the light emission control driver 40. In addition, the timing controller 50 may generate the four control signals SR, SS, SPU, and SPD and deliver them to the four input signals terminals SR, SS, UI, and DI included in the light emission control circuit 100 of each stage. These clock signals and control signals supplied to the light emission control driver 40 from the timing controller 50 will be collectively defined as light emission driving control signals (ECS).

In the present example embodiment, the three clock signals input to the three clock signal terminals CK1, CK2, and CK3 included in the plurality of light emission control circuits 100 may be different. Thus, the first clock signal ck1, the second clock signal ck2, and the third clock signal ck3 may be sequentially alternately delivered to the three clock signal terminals CK1, CK2, and CK3 included in each the light emission control circuit of each stage of the plurality of light emission control circuits 100.

In the example embodiment illustrated in FIG. 2, there are three clock signal terminals and three input clock signals. In an implementation, a delivery pattern of the clock signals is repeated at every three light emission control circuits of the three stages.

In detail, the first clock signal ck1, the second clock signal ck2, and the third clock signal ck3 are delivered to the clock signal terminals CK1, CK2, and CK3 of the light emission control circuit ED1 of the first stage, respectively. Next, the second clock signal ck2, the third clock signal ck3, and the first clock signal ck1 are delivered to the clock signal terminals CK1, CK2, and CK3 of the light emission control circuit ED2 of the second stage, respectively. Then, the third clock signal ck3, the first clock signal ck1, and the second clock signal ck2 are delivered to the clock signal terminals CK1, CK2, and CK3 of the light emission control circuit ED3 of the third stage, respectively. The light emission control circuit ED4 of the fourth stage repeats the delivery pattern of the clock signals of the light emission control circuit ED1 of the first stage, and in this manner, the delivery pattern of the clock signals is repeated at every three light emission control circuits of the three stages.

Meanwhile, the control signals SR and SS delivered from the timing controller 50 are delivered to the input signal terminals SR and SS of the light emission control circuit 100 of each stage, respectively.

In FIG. 2, the control signals SPU and SPD delivered from the timing controller 50 are delivered to the input signal terminals UI and DI of the light emission control circuit ED1 of the first stage, respectively. A light emission control driving method according to an example embodiment (to be described below with reference to FIGS. 3 to 5) includes a light emission duty of a light emission control signal being controlled by adjusting the period during which the pulse of a gate ON voltage level of the control signals SPU and SPD is delivered in the progressive light emission mode.

In the light emission control circuits ED2, ED3, . . . of the respective stages that follow the first stage, output signals output during a driving process may be input as control signals to the input signal terminals UI and DI of the light emission control circuit positioned at the next stage of the corresponding stage. For example, in FIG. 2, a first output signal uo[1] output in the process of driving the light emission control circuit ED1 of the first stage, among the plurality of light emission control circuits 100, is delivered as the input signal terminal UI of the light emission control circuit ED2 of the second stage, and a second output signal do[1] is delivered to the input signal terminal D1 of the light emission control circuit ED2 of the second stage.

Meanwhile, the light emission control circuits 100 of the respective stages may generate the light emission control signals em[1], em[2], . . . , and deliver them to corresponding light emission control lines among the plurality of light emission control lines through an output signal terminal OUT.

In a light emission control driving scheme of the light emission control driver 40 according to an example embodiment, when the light emitting display device is in the simultaneous light emission mode, it is controlled by the control signals SR and SS input to the light emission control circuits 100 of the respective stages, and, when the light emitting display device is in the progressive light emission mode, it is controlled by the plurality of clock signals and control signals SPU and SPD input to the light emission control circuits 100 of the respective stages.

In an implementation, light emission duties of a light emission duration and non-light emission duration in the simultaneous light emission mode are adjusted by light emission control signals regulated according to the pulse width of the control signals SR and SS. Also, in the case of the progressive light emission mode, duties of sequential light emission duration and non-light emission duration of the plurality of pixels included in the plurality of pixel rows are adjusted by light emission control signals whose pulse widths are adjusted according to the control signals SPU and SPD.

A light emission control method according to an example embodiment will now be described with reference to a circuit diagram of a light emission control circuit 100 illustrated in FIG. 3, and driving timing diagram of FIGS. 4 and 5 applied to the circuit diagram of FIG. 3.

Figure 3:
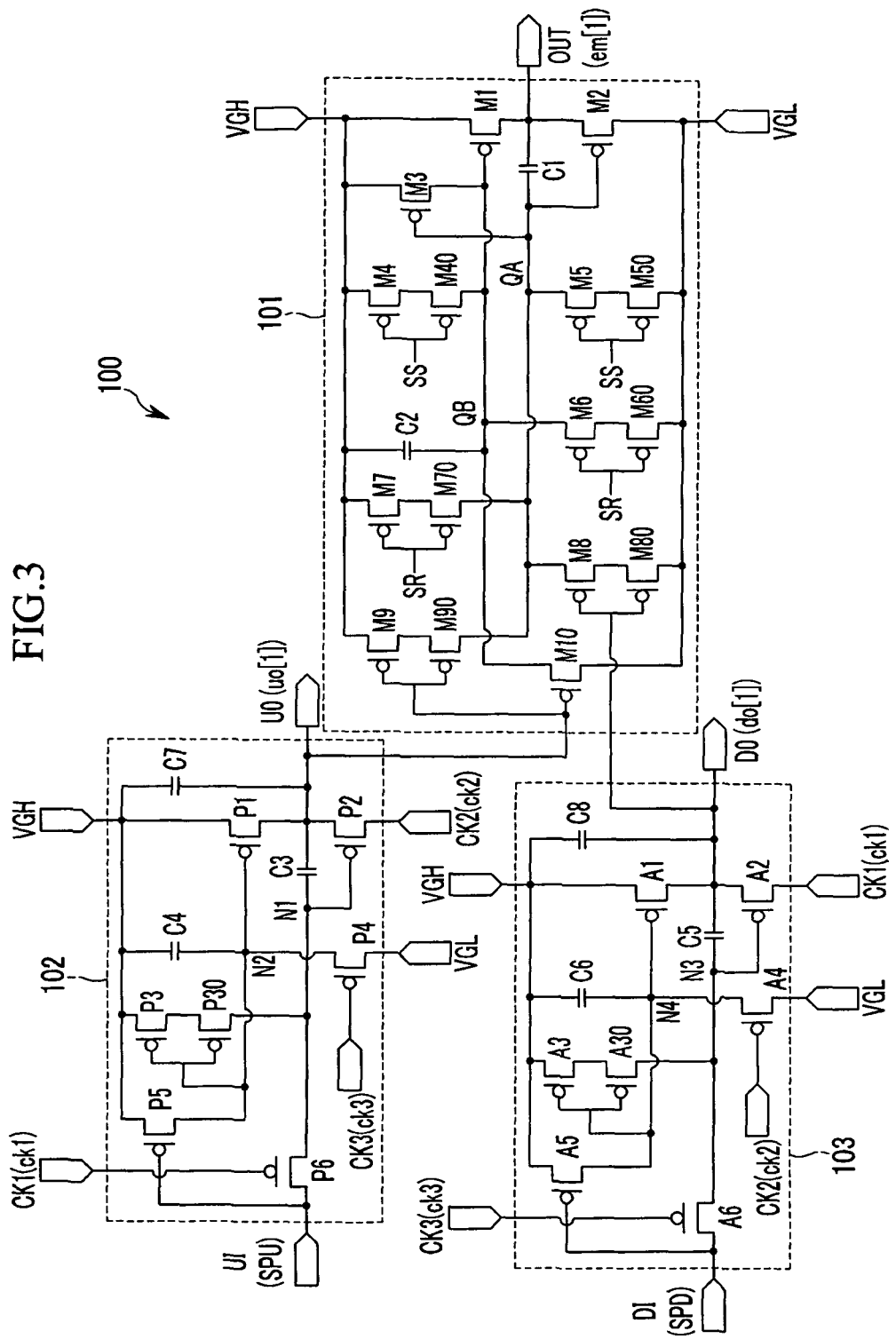
FIG. 3 illustrates a circuit diagram of a light emission control circuit illustrated in FIG. 2 according to an example embodiment.

FIG. 3 illustrates the circuit diagram of the first light emission control circuit 100 among the plurality of light emission control circuits ED1 to EDn constituting the light emission control driver 40 according to an example embodiment.

In FIG. 3, the light emission control circuit 100 of the first stage includes an output controller 101 that receives the first control signal SR and the second control signal SS and outputs the light emission control signal em[1] to be delivered to the first light emission control line. The light emission control circuit 100 of the first stage also includes a first logic unit 102 that receives the third control signal SPU and the first to third clock signals ck1 to ck3, and outputs the first output signal uo[1]. The light emission control circuit 100 of the first stage also includes a second logic unit 103 that receives the fourth control signal SPD and the first to third clock signals ck1 to ck3, and outputs the second output signal DO[1].

As described above, the light emission control circuit 100 is the first one of the first stage among the plurality of light emission control circuits, so the clock signals, the third control signal, and the fourth control signal input to the plurality of light emission control circuits following the first stage are repeated with a certain pattern so as to be delivered.

Thus, the first to third clock signals ck1 to ck3 are alternately delivered sequential to the first to third clock signal terminals CK1 to CK3 of the first and second logic units 102 and 103 according to the positions of the light emission control circuits. Also, only in the light emission control circuit 100 of the first stage, the SPU is delivered as a third control signal to the input signal terminal UI and the SPD is delivered as a fourth control signal to the input signal terminal D1, and, in the following stages, the first output signal that has been output from the output signal terminal UO of the previous stage is delivered as a third control signal to the input signal terminals UI of the light emission control circuits of the plurality of stages, and the second output signal that has been output from the output signal terminal DO of the previous stage is delivered as a fourth control signal to the input signal terminal D1 of the light emission control circuits of the plurality of stages.

Also, with reference to FIG. 3, in the light emission control circuit 100 according to an example embodiment, the first output signal ui[1] output from the first logic unit 102 and the second output signal do[1] output from the second logic unit 103 are delivered to the output controller 101.

Upon receiving the first output signal uo[1] and the second output signal do[1], the output controller 101 may be driven by the input first and second control signals SR and SS together with the first output signal uo[1] and the second output signal do[1], to generate and output the light emission control signal em[1].

In FIG. 3, the output controller 101 includes transistors M1 to M10; a first capacitor C1, and a second capacitor C2. In addition, the output controller 101 may further include transistors M40 to M90 connected in series to the transistors M4 to M9. In this case, source electrodes of the transistors M40 to M90 are connected to drain electrodes of the transistors M4 to M9, respectively, and gate electrodes of the M40 to M90 are connected to the gate electrodes of the transistors M4 to M9, respectively, so as to receive the same signals, so a description of the transistors M40 to M90 will be replaced by the description of the transistors M4 to M9.

In the output controller 101 in FIG. 3, source electrodes of the transistors M1, M3, M4, M7, and M9 are connected to a first power source voltage VGH of high potential, respectively, a drain electrode of the transistor M1 is connected to one end of the first capacitor C1, drain electrodes of the transistors M3 and M4 are connected to a node QB, respectively, and drain electrodes of the transistors M7 and M9 are connected to a node QA, respectively.

A gate electrode of the transistor M1 is connected to the node QB, a gate electrode of the transistor M3 is connected to the node QA, a gate electrode of the transistor M4 is connected to the second control signal SS, and a gate electrode of the transistor My is connected to the first control signal SR. A gate electrode of the transistor M9 is connected to the first output signal uo[1] of the first logic unit 102.

In the output controller 101 in FIG. 3, source electrodes of the transistors M2, M5, M6, M8, and M10 are connected to a second power source voltage VGL of low potential (which may be lower than that of the first power source voltage VGH), respectively, a drain electrode of the transistor M2 is connected to one end of the first capacitor C1, drain electrodes of the transistors M6 and M10 are connected to the node QB, respectively, and drain electrodes of the transistors M5 and M8 are connected to the node QA, respectively.

A gate electrode of the transistor M2 is connected to the node QA to which another end of the first capacitor C1 is connected, a gate electrode of the transistor M5 is connected to the second control signal SS, and a gate electrode of the transistor M6 is connected to the first control signal SR. A gate electrode of the transistor M8 is connected to the second output signal do[1] of the second logic unit 103, and a gate electrode of the transistor M10 is connected to the first output signal uo[1] of the first logic unit 102.

One end of the first capacitor C1 of the output controller 101 is connected to the output signal terminal OUT from which the light emission control signal em[1] is output, and the other end of the first capacitor C1 is connected to the node QA. One end of the second capacitor C2 is connected to the first power source voltage VGH, and another end of the second capacitor C2 is connected to the node QB.

In the circuit diagram of FIG. 3, the first logic unit 102 includes transistors P1 to P6, a third capacitor C3, and a fourth capacitor C4. The first logic unit 102 may further include a transistor P30 connected in series to the transistors P3

The transistor P1 includes a source electrode connected with the first power source voltage VGH, a drain electrode connected to a contact point at which one end of the third capacitor C3 and the first output signal terminal UO meet, and a gate electrode connected to a node N2.

The transistor P2 includes a source electrode connected to the second clock signal ck2, a drain electrode connected to a contact point at which one end of the third capacitor C3 and the first output signal terminal UO meet, and a gate electrode connected to a node N1.

The transistor P3 includes a source electrode connected with the first power source voltage VGH, a drain electrode connected to the node N1, and a gate electrode connected to the node N2. According to an example embodiment, the first logic unit 102 may further include at least one transistor connected in series with the transistor P3. In FIG. 3, the transistor P30 is further included, which may include a gate electrode connected in the same manner as the gate electrode of the transistor P3, a source electrode connected to the drain electrode of the transistor P3, and a drain electrode connected to the node N1.

The transistor P4 includes a source electrode connected to a second power source voltage VGL, a drain electrode connected with the node N2, and a gate electrode connected to the third clock signal ck3.

The transistor P5 includes a source electrode connected with the first power source voltage VGH, a drain electrode connected with the node N3, and a gate electrode connected to the input signal terminal UI to which the third control signal SPU is delivered. In this case, the third control signal SPU delivered from the timing controller 50 may be input only to the input signal terminal UI of the first logic unit 102 of the light emission control circuit 100 of the first stage, and the first output signal output from the output signal terminal UO of the light emission control circuit of the previous stage may be input to the light emission control circuits of the following stages.

The transistor P6 includes a source electrode connected to the input signal terminal UI, a drain electrode connected to the node 1, and a gate electrode connected to the first clock signal ck1.

The third capacitor C3 includes one end connected to a contact point at which the drain electrode of the transistor P1, the source electrode of the transistor P2, and the output signal terminal UO meet, and another end connected to the node N1.

The fourth capacitor C4 includes one end connected to the first power source voltage VGH and another end connected to the node N2.

The first logic unit 102 may further include a capacitor C7 having one end connected to the first power source voltage VGH and another end connected to the output signal terminal UO, according to circumstances.

Meanwhile, the second logic unit 103 illustrated in the circuit diagram of FIG. 3 may be the same as the circuit configuration of the first logic unit 102 while receiving different input and output signals. The second logic unit 103 will now be described based on the difference.

In FIG. 3, the second logic unit 103 includes transistors A1 to A6, a fifth capacitor C5, and a sixth capacitor C6. In this case, the second logic unit 103 may further include a transistor A30 connected in series with the transistor A3. The second logic unit 103 may further include a capacitor C8 having one end connected to the first power source voltage VGH and another end connected to the output signal terminal DO.

As compared to the first logic unit 102, the second logic unit 103 includes the input signal terminal DI, and the fourth control signal SPD delivered from the timing controller 50 is input to the input signal terminal D1. In this case, the second logic unit of the light emission control circuits of the stages following the first stage may receive the second output signal output from the output signal terminal DO of the light emission control circuit of the previous stage.

The second logic unit 103 outputs the second output signal do[1] through the output signal terminal DI. The second output signal do[1] is delivered to the output controller 101 and is also delivered to the input signal terminal DI of the light emission control circuit of the second stage.

In the second logic unit 103 in FIG. 3, a source electrode of the transistor A2 is connected to the first clock signal terminal CK1, and the first clock signal ck1 is received from the first clock signal terminal CK1. A gate electrode of the transistor A4 is connected to the second clock signal terminal CK2 and receives the second clock signal ck2. The transistor A6 includes a source electrode connected to the input signal terminal DI, a drain electrode connected to a node N3, and a gate electrode connected to the third clock signal terminal CK3, and receives a third clock signal ck3 through the third clock signal terminal CK3.

A method for controlling driving of a light emission control signal output after being generated in order to implement the simultaneous light emission mode or the progressive light emission mode in the light emission control circuit will now be described with reference to FIGS. 4 and 5.

Figure 4:
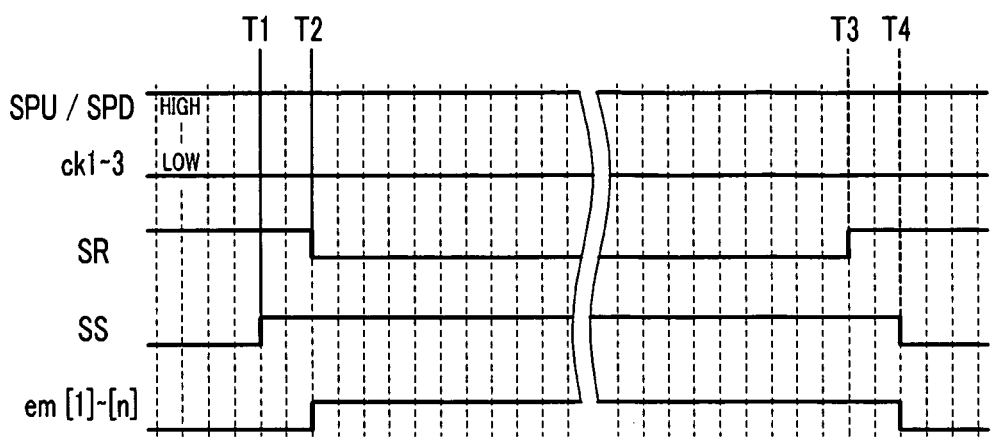
FIG. 4 illustrates a driving timing diagram when the light emission control circuit illustrated in FIG. 2 is implemented in a simultaneous light emission mode.

FIG. 4 illustrates an example driving timing diagram of driving waveforms supplied to the light emission control circuit 100 illustrated in FIG. 3. The driving timing diagram of FIG. 4 shows the waveforms of all the light emission control signals em[1]~[n] output to the plurality of light emission control lines from the entire light emission control circuits, as well as the light emission control signal em[1] output through the light emission control circuit of the first stage. Thus, FIG. 4 is a timing diagram with respect to the operation of the light emission control circuit 100 that controls output of a plurality of light emission control signals that simultaneously illuminate all of the plurality of pixels of the display unit 10 or not in the simultaneous light emission mode.

The output of the light emission control signals implementing the simultaneous light emission scheme according to an example embodiment will now be described with reference to FIGS. 3 and 4.

In an example embodiment of the simultaneous light emission mode, the third control signal SPU and the fourth control signal SPD, which are input to the input signal terminals UI and DI of the first logic unit 102 and the second logic unit 103 of the light emission control circuit, are transferred a high level voltage, respectively. Also, the clock signals ck1 to ck3 are all delivered with a low level voltage to the first and second logic units 102 and 103.

Then, because the third control signal SPU of the first logic unit 102 has a high pulse, it turns off the transistor P5, and a high level voltage is delivered to the node N1 through the transistor P6 that has been turned on by a low pulse of the first clock signal ck1. Upon receiving the high level voltage through its gate electrode, the transistor P2 is also turned off.

When the transistor P2 is turned by the low pulse of the third clock signal ck3, the second power source voltage VGL of low potential is applied to the node N2, and accordingly, the transistors P1, P3, and P30 are turned on. Then, the first power source voltage VGH of high potential is applied to the node N1 through the transistors P3 and P30 to thus charge the third capacitor C3 with high potential. Also, the high potential voltage of the first power source voltage VGH is delivered with the voltage level of the pulse of the first output signal uo[1] through the transistor P1.

The second logic unit 103 outputs the second output signal do[1] with a high level voltage pulse according to the same driving scheme.

Accordingly, a logic unit of a front stage of the light emission control circuit including the first and second logic units 102 and 103 does not operate in the simultaneous light emission mode. In particular, by applying the first power source voltage VGH to the nodes N1 and N3, respectively, while maintaining the pulses of the clock signal ck1 at a low level, the transistors P2 and A2 can be maintained in a turn-off state and a portion floating to the logic units can be minimized.

Referring again to the circuit diagram of FIG. 3, the first and second output signals output from the first and second logic units 102 and 103, respectively, may be constantly maintained to have a high level and delivered to the light emission control circuit of the next stage. Thus, all the light emission control circuits may generate a plurality of the same light emission control signals implemented in the simultaneous light emission mode.

In a state that all of the logic units of previous stages of the plurality of light emission control circuits of the light emission driver 40 do not operate, the output controller 101 receives the first output signal uo[1] of the first logic unit 102 and the second output signal do[1] of the second logic unit 103 with a high level voltage, and adjusts the pulse width of the light emission control signal em[1] by adjusting the pulse width of the first control signal SR and the second control signal SS that have been received together.

In detail, the first control signal SR is delivered with a low level pulse from a high level and the second control signal SS is delivered with a high level voltage at a time point T2. In this case, the first power source voltage VGH of high potential is applied to the node QA through the transistor M7 and delivered to the gate electrodes of the transistors M2 and M3 to turn off the transistors M2 and M3. At the same time, the second power source voltage VGL of low potential is applied to the node QB through the transistor M6 and delivered to the gate electrode of the transistor M1 to turn on the transistor M1. Then, the first power source voltage VGH of high potential generates the light emission control signal em[1] with a high level voltage pulse through the transistor M1. The first power source voltage VGH of high potential that has been delivered through the transistor M7 is applied to the node QA and charged to the first capacitor C1 to reliably maintain switching turn-off of the transistor M2 to prevent a leakage of current toward the transistor M2.

Meanwhile, while the first output signal uo[1] and the second output signal do[1] are both delivered with a high level voltage, the second control signal SS is delivered with a low level pulse from a high level at a time point T4, and, when, the first control signal SR is a high level pulse, the first power source voltage VGH of high potential is applied to the node QB through the transistor M4 and delivered to the gate electrode of the transistor M1 to turn off the transistor M1. At the same time, the second power source voltage VG of low potential is applied to the node QA through the transistor M5 and delivered to the gate electrodes of the transistors M2 and M3 to turn on the transistors M2 and M3. Then, the high potential voltage that has been charged to the first capacitor C1 is quickly discharged, and the second power source voltage VGL of low potential is delivered to the output signal terminal OUT through the transistor M2. Then, the light emission control signal em[1] is generated with a low level voltage pulse. The first power source voltage VGH of high potential is delivered to the node QB through the transistors M3 and M4 to reliably maintain switching turn-off of the transistor M1 to thus prevent a leakage of current toward the transistor M1.

Accordingly, the pulse width of the light emission control signal may be controlled by adjusting the period of the first control signal SR and the second control signal SS delivered with the low level pulse from the high level. In the example embodiment shown in the waveform view of FIG. 4, the plurality of light emission control signals output from the light emission control driver 40 are all output with the same form and timing in the simultaneous light emission mode to simultaneously control light emission of the display unit 10. During the period from the time point T2 to the time point T4 at which the light emission control signals em[1]-[n] are delivered with a high level voltage, the driving transistors of the plurality of pixels are not illuminated if they are implemented as PMOS, and are illuminated during the other remaining period.

In an example embodiment, the first control signal SR and the second control signal SS are designed to have mutually opposite phases, and the phases of the control signals may change at the same time point, or as shown in FIG. 4, they may change at different times.

If the first control signal SR and the second control signal SS are adjusted such that their phases change simultaneously, the transistors that receive signals instantaneously by a rising time and a falling time of the respective signals would possibly be simultaneously turned on or turned off to cause an interval during which a short circuit current flows. Thus, in order to prevent this, as shown in FIG. 4, the second control signal SS may be adjusted such that it has a high level earlier by two horizontal periods (2H) than the first control signal SR and has a low level later by two horizontal periods (2H) than the first control signal SR.

Meanwhile, in order to smoothly control the plurality of pixels to be illuminated or non-illuminated simultaneously by the light emission control signals em[1]~[n], a slew rate of the first control signal SR and the second control signal SS may be adjusted. For example, the period of the rising time or falling time of each of the first control signal SR and the second control signal SS may be adjusted to be at least 4H or more to make the phase changes of the thusly generated light emission control signal em[1]~[n] gentle, whereby a phenomenon that current is instantly and rapidly changed can be prevented and a stable modular operation can be implemented.

Figure 5:
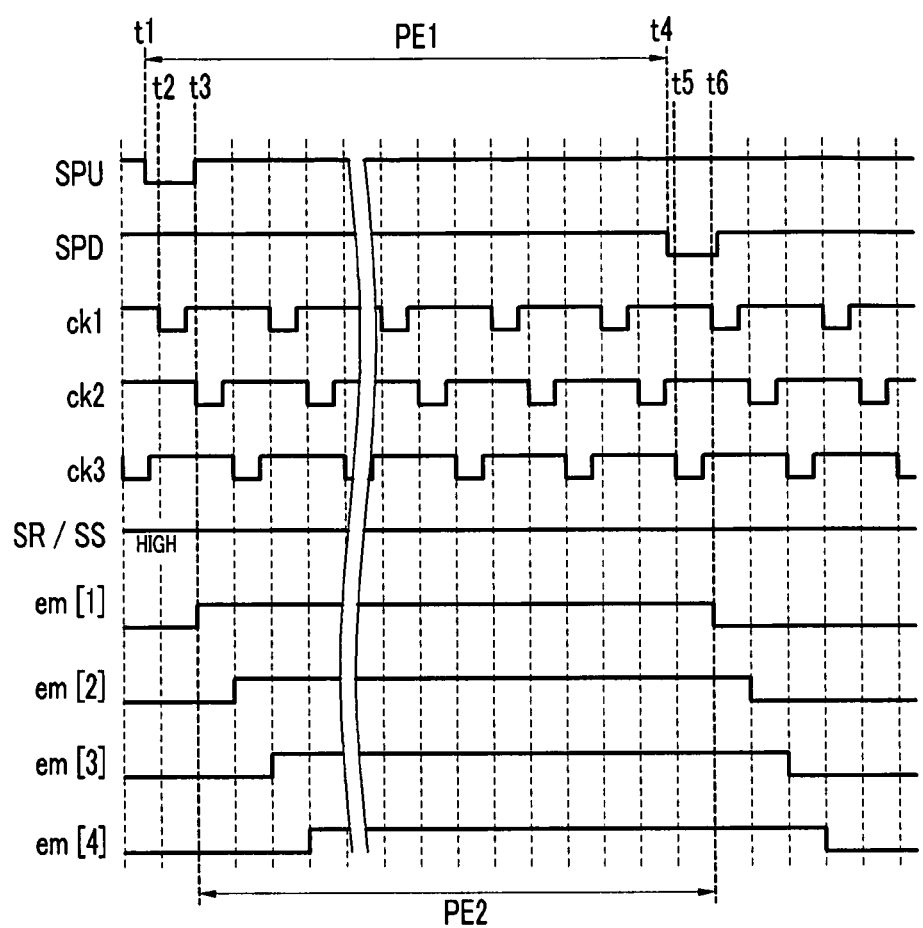
FIG. 5 illustrates a driving timing diagram when the light emission control circuit illustrated in FIG. 2 is implemented in a progressive light emission mode.

The process of generating light emission control signals implementing the sequential light emission scheme of the light emission display device according to an example embodiment by using the light emission control circuit according to the embodiment of FIG. 3 operating with the driving timing as shown in FIG. 5 will now be described.

In the example progressive light emission mode of FIG. 5, the first control signal SR and the second control signal SS are maintained to have a high level pulse. Then, the corresponding transistors M4, M40, M5, M50, M6, M60, M7, and M70 of the output controller 101, which receive the first control signal SR and the second control signal SS, are turned off during the period of the progressive light emission mode.

First, when the third control signal SPU is delivered with a phase has been changed from a high level to a low level at a time point t1, the transistor P5 is turned on and the first power source voltage VGH of high potential is delivered to the node N2 through the transistor P5. Also, as the high potential voltage is applied to the node N2, the transistor P1 is turned off.

Thereafter, when the first clock signal ck1 is delivered with a low level to the transistor P6 at a time point t2, the transistor P6 is turned on to deliver a low level voltage to the node N1. Accordingly, the third capacitor C3 is charged and the transistor P2 is turned on. Then, the pulse of the first output signal uo[1] is generated corresponding to the voltage level of the pulse of the second clock signal ck2 delivered through the transistor P2. Thus, it is at a high level state according to the voltage level of the pulse of the second clock signal ck2 at the time point t2, and then when the phase of the second clock signal ck2 is changed to a low level state at a time point t3, the first output signal uo[1] is delivered with a low level starting from the time point t3.

Then, the first output signal uo[1] is delivered with the low level to the input signal terminal UI of the light emission control circuit of the next stage, and at the same time, is input to the output controller 101.

When the first output signal uo[1] with the low level is delivered, the transistors M9, M90, and M10 of the output controller 101 are turned on, the first power source voltage VGH is applied to the node QA by the transistors M9 and M90, the first capacitor C1 is charged with a high potential voltage, and the transistors M2 and M3 are turned off. Meanwhile, the second power source voltage VGL is delivered to the node QB through the transistor M10, the second capacitor C2 is charged with a low potential voltage, and the transistor M1 is turned on to output the light emission control signal em[1] with the high level of the first power source voltage VGH.

The light emission control signal em[1] is output with the high level by the voltage charged in the first capacitor C1 and the second capacitor C2 during a certain period (i.e., a period PE2 in FIG. 5). During the period PE2 in which the light emission control signal em[1] is output with the high level, the pixels of the first pixel row of the display unit 10, when configured as a PMOS, respectively, receive the light emission control signal em[1], so they are not illuminated.

During the period PE2, the fourth control signal SPD delivered to the input signal terminal D1 of the second logic unit 103 has a high level, so the second logic unit 103 does not operate regardless of the pulse levels of the clock signals ck1 to ck3.

When the phase of the fourth control signal SPD delivered to the input signal terminal DI of the second logic unit 103 is changed from the high state to a low state at a time point t4, the transistor A5 is turned on and the first power source voltage VGH of high potential is delivered to the node N4 through the transistor A5. Also, because the high potential voltage is applied to the node N4, the transistor A1 is turned off.

Thereafter, when the third clock signal ck3 is delivered with a low level to the transistor A6 at a time point t5, the transistor A6 is turned on to deliver the low level voltage to the node N3. Accordingly, the fifth capacitor C5 is charged and the transistor A2 is turned on. Then, the pulse of the second output signal do[1] is generated corresponding to the voltage level of the pulse of the first clock signal ck1 delivered through the transistor A2. Thus, it is at the high state according to the voltage level of the pulse of the first clock signal ck1 at the time point t5, and, when the phase of the first clock signal ck1 is changed to a low state at a time point t6, the second output signal do[1] is delivered with the low level starting from the time point t6.

In the example waveforms shown FIG. 5, the third control signal SPU is maintained at the high state starting from the time point t3. Thus, the first logic unit 102 does not operate regardless of the pulse levels of the clock signals ck1 to ck3 and only the second output signal do[1] with the low level is delivered to the output controller 101.

Also, the second output signal do[1] is delivered in the low state to the input signal terminal D1 of the light emission control circuit of the next stage.

When the second output signal do[1] in the low state is delivered at the time point t6, the transistors M8 and M80 of the output controller 101 are turned on, the second power source voltage VGL is applied to the node QA by the transistors M8 and M80, the first capacitor C1 is quickly discharged, and the transistors M2 and M3 are turned on. Then, the first power source voltage VGH is applied to the node QB through the transistor M3 to turn off the transistor M1. At the same time, the low level voltage of the second power source voltage VGL is delivered to output the light emission control signal em[1] with a low level.

During the period as long as the non-light emission period (i.e., the period PE2) starting from the time point t6, the light emission control signal em[1] is output with the low level by the voltage charged in the first capacitor C1 and the second capacitor C2. During the period in which the light emission control signal em[1] is output with the low level, the pixels of the first pixel row of the display unit 10, when configured as a PMOS, respectively, receive the light emission control signal em[1] so as to be illuminated.

Meanwhile, the light emission control circuit of the second stage receives the first output signal uo[1] and the second output signal do[1] with a low level by the input signal terminals UI and DI, respectively, and, in this case, the time point at which the output signals are delivered with the low level pulse comes later by one horizontal period than the time point at which the third control signal SPU and the fourth control signal SPD of the first light emission control circuit are delivered with the low level.

Also, the clock signals delivered to the clock signal terminals CK1 to CK3 of the first and second logic units 102 and 103 of the light emission control circuit of the second stage are different from those of the light emission control signal of the first stage as shown in FIG. 2. Thus, in the light emission control circuit of the second stage, the second clock signal ck2 is input to the clock signal terminal CK1, the third clock signal ck3 is input to the clock signal terminal CK2, and the first clock signal ck1 is delivered to the clock signal terminal CK3, and driven according to each time.

Then, light emission control signal em[2] output from the light emission control circuit of the second stage is generated to rise to have a high level later by one horizontal period than the first light emission control signal em[1] and have the same light emission duty.

The foregoing process is repeatedly performed in the plurality of light emission control circuits to generate a plurality of light emission control signals shifted by one horizontal period (1H) and having the same light emission duty.

As described above, the light emission control signals, which may be applicable to both the simultaneous light emission scheme and the sequential light emission scheme of the display unit 10, may be generated from the light emission control circuit having the circuit configuration according to an example embodiment. The light emission duty ratio of the light emission control signals may be adjusted through the first to fourth control signals, and the simultaneous light emission mode and the progressive light emission mode may be selectively implemented. Thus, the advantageous function of the light emitting display can be extended to provide a high quality product.

Figure 6:
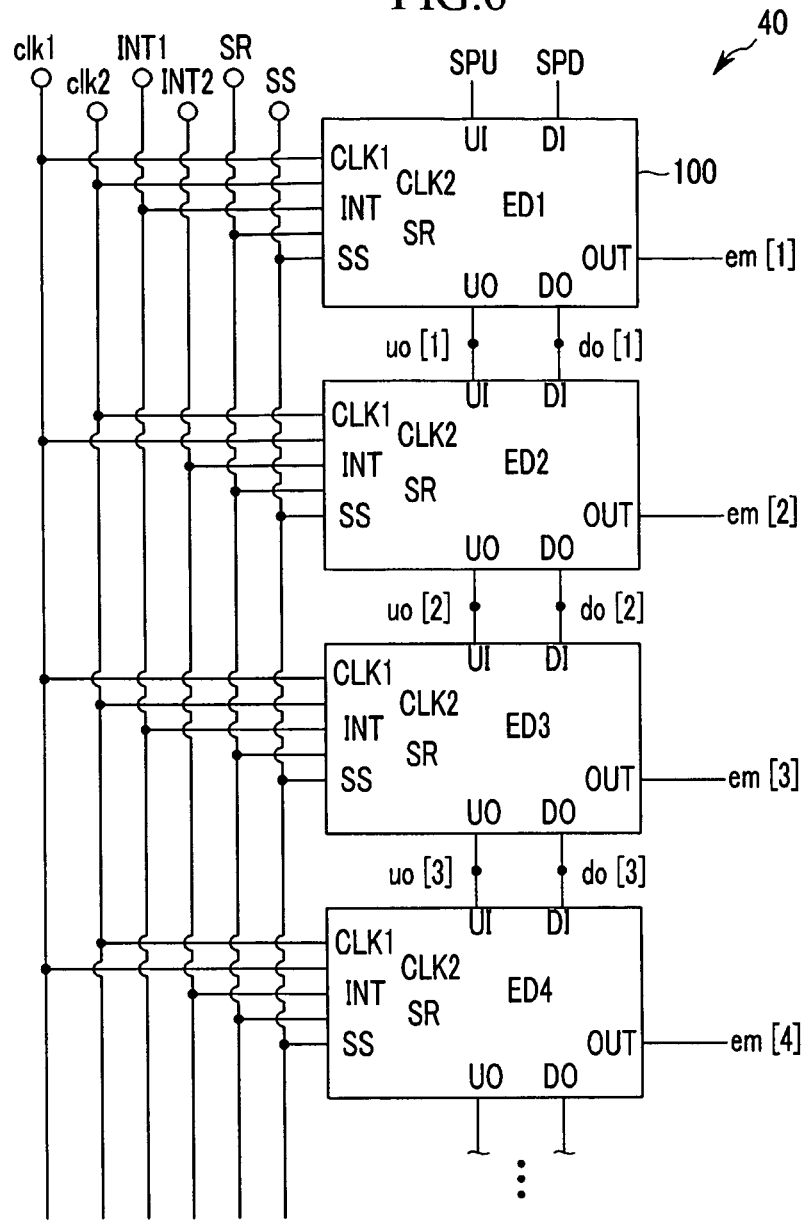
FIG. 6 illustrates a schematic block diagram showing another example of the light emission control driver illustrated in FIG. 1.
Figure 7:
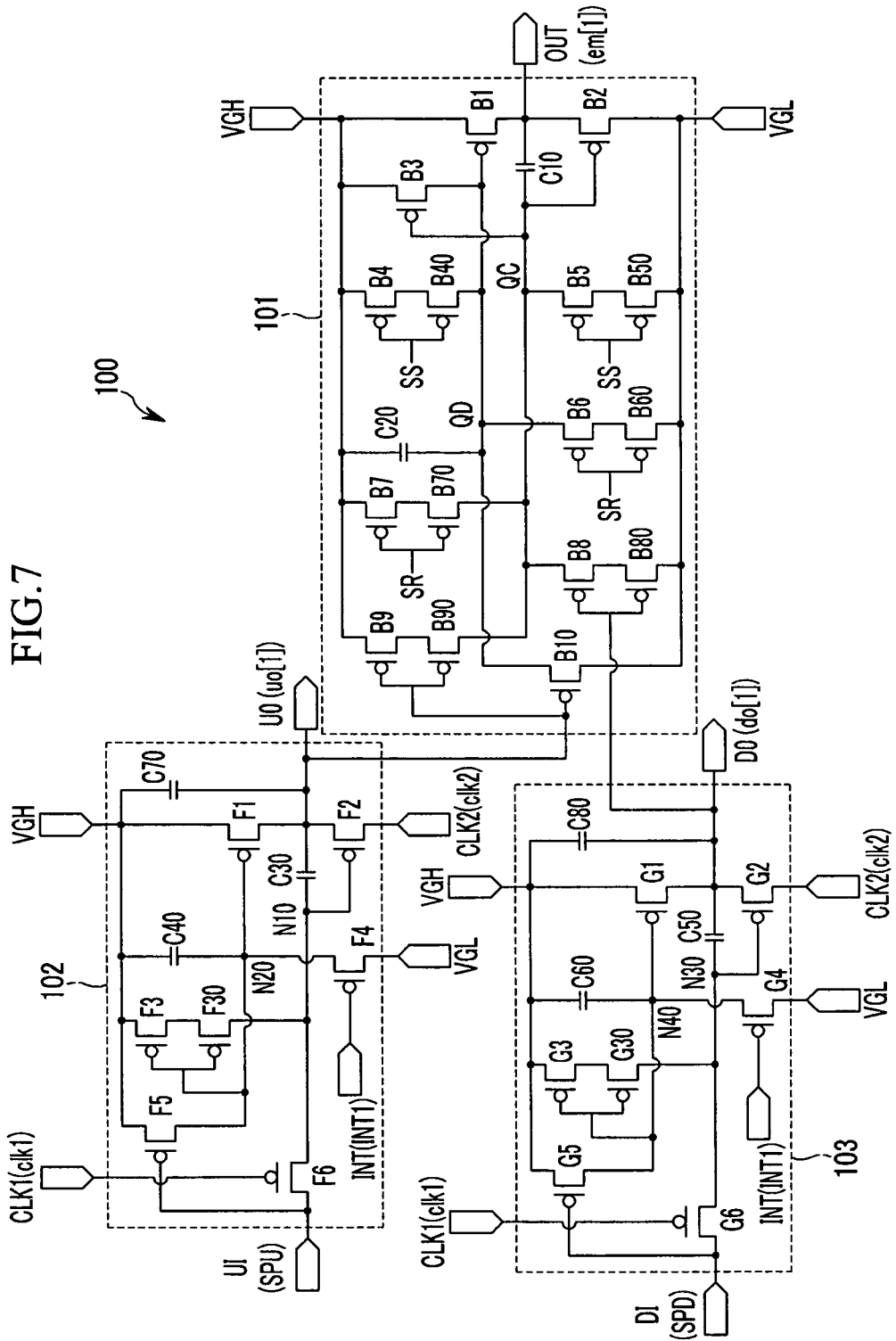
FIG. 7 illustrates a circuit diagram of a light emission control circuit illustrated in FIG. 6 according to an example embodiment.

FIG. 6 illustrates a schematic block diagram showing another example of the light emission control driver illustrated in FIG. 1, and FIG. 7 illustrates a circuit diagram of a light emission control circuit illustrated in FIG. 6 according to an example embodiment.

The example embodiment illustrated in FIGS. 6 and 7 is similar to the example embodiment described above with reference to FIGS. 2 to 5; the description below of the present example embodiment will emphasize the different features.

With reference to FIG. 6, in the light emission control driver 40 according to the present example embodiment, the number of clock signal terminals is reduced to two clock signal terminals CLK1 and CLK2, and it additionally includes a start signal terminal INT.

One more control signal is added to the number of control signals delivered from the timing controller 50 to the light emission control driver 40 in the embodiment of FIG. 2. Thus, the timing controller 50 delivers the first clock signal clk1 and the second clock signal clk2 input to the clock signal terminals CLK1 and CLK2, a first start signal INT1 and a second start signal INT2 selectively delivered to a start signal terminal INT, and the first control signal SR, the second control signal SS, the third control signal SPU, and the fourth control signal SPD.

The first clock signal clk1 and the second clock signal clk2 are alternately delivered sequentially to each of the plurality of light emission control circuits constituting the light emission control driver 40.

Also, the first start signal INT1 and the second start signal INT2 are alternately delivered to the start signal terminal INT of each of the plurality of light emission control circuits. The others are the same as those of the embodiment of FIG. 2, so their detailed description will not be repeated.

FIG. 7 illustrates a circuit diagram of the light emission control circuit 100 of the first stage among the plurality of light emission control circuits according to an example embodiment illustrated in FIG. 6.

The configuration of the circuit diagram of FIG. 7 is similar to that of the embodiment illustrated in FIG. 3. In the example embodiment shown in FIG. 7, the first clock signal clk1 is delivered to the clock signal terminal CLK1 connected to a gate electrode of a transistor F6 of the first logic unit 102, the first start signal INT1 is delivered to the start signal terminal INT connected to a gate electrode of a transistor F4, and a source electrode of a transistor F2 is connected to the clock signal terminal CLK2 to deliver the voltage level of the second clock signal clk2 when the transistor F2 is turned on to output a voltage pulse of the first output signal uo[1].

Likewise, the first clock signal clk1 is delivered to the clock signal terminal CLK1 connected to a gate electrode of a transistor G6 of the second logic unit 103, the first start signal INT1 is delivered to the start signal terminal INT connected to a gate electrode of a transistor G4, and a source electrode of a transistor G2 is connected to the clock signal terminal CLK2 to deliver the voltage level of the second clock signal clk2 when the transistor G2 is turned on to output a voltage pulse of the second output signal do[1].

In the example embodiment of FIG. 3, the circuit configuration and input clock signals of the first and second logic units 102 and 103 are different, but comparatively, the example embodiment of FIG. 7 has the characteristic that the circuit configuration and the input clock signals and start signals of the first and second logic units 102 and 103 are the same.

Figure 8:
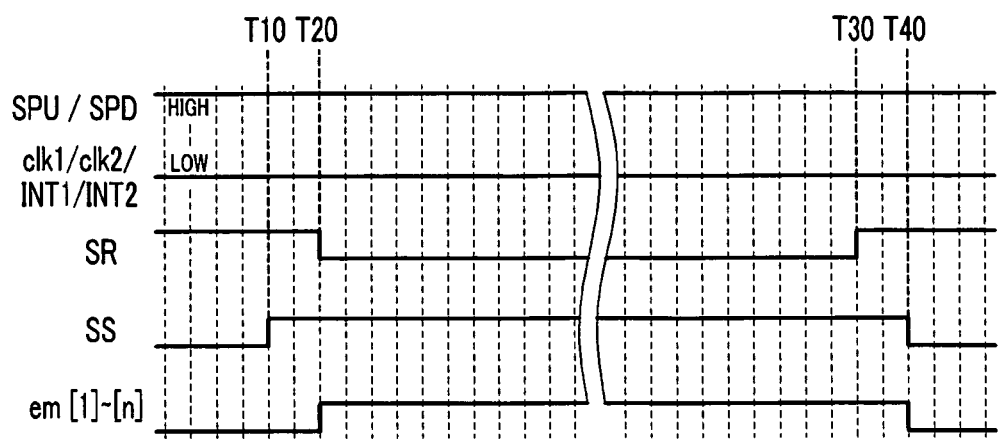
FIG. 8 illustrates a driving timing diagram when the light emission control circuit illustrated in FIG. 6 is implemented in a simultaneous light emission mode.

FIG. 8 illustrates an example timing diagram of signals driven in the light emission control circuit according to the example embodiment of FIG. 7 in case of the simultaneous light emission mode.

The example embodiment in FIG. 8 also employs the driving scheme in which the pulse widths of the plurality of light emission control signals em[1]~[n] are adjusted by adjusting the pulse widths of the first control signal SR and the second control signal SS in a state that the third control signal CPU and the fourth control signal SPD are delivered with a high level voltage to not operate the first and second logic units 102 and 103, which is the same as the driving method according to the example embodiment of FIG. 4.

Figure 9:
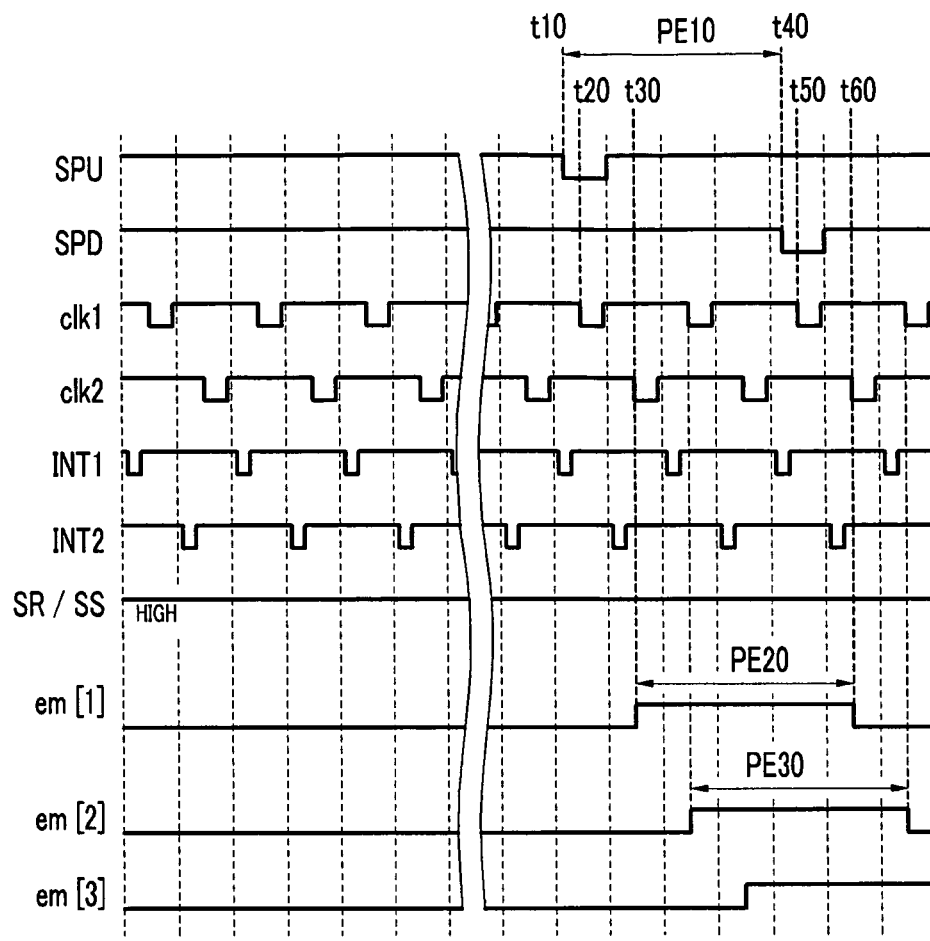
FIG. 9 illustrates a driving timing diagram when the light emission control circuit illustrated in FIG. 6 is implemented in a progressive light emission mode.

FIG. 9 illustrates an example driving timing diagram when the light emission control circuit illustrated in FIG. 6 is implemented in a progressive light emission mode.

In the example progressive light emission mode shown in FIG. 9, the first control signal SR and the second control signal SS are maintained with a high level pulse. Then, the corresponding transistors B4, B40, B5, B50, B6, B60, B7, and B70 of the output controller 101 are turned off during the period of the progressive light emission mode.

When the phase of the third control signal SPU is changed to a low level at a time point t10, a transistor F5 is turned on and the first power source voltage VGH is delivered to the node N20. Also, as the high voltage is applied to the node N20, the transistor F1 is turned off.

Thereafter, when the first clock signal clk1 is delivered with a low level to the transistor F6 at a time point t20, the transistor F6 is turned on to deliver a low level voltage to the node N10. Accordingly, a third capacitor C30 is charged and the transistor F2 is turned on. Then, the first output signal uo[1] is generated corresponding to the voltage level of the pulse of the second clock signal clk2. Accordingly, the first output signal uo[1] is delivered in the low state by the low level pulse of the second clock signal clk2, starting from a time point t30.

Then, the first output signal uo[1] is delivered with the low level to the input signal terminal UI of the light emission control circuit of the next stage, and at the same time, is input to the output controller 101.

When the first output signal uo[1] with the low level is delivered, the output controller 101 outputs the light emission control signal em[1] with the high level of the first power source voltage VGH, starting from the time point t30, according to the process as described above with reference to FIG. 5.

The light emission control signal em[1] is output with the high level by the voltage charged in a first capacitor C10 and a second capacitor C20 included in the output controller 101 during a period PE20. During the period PE20 in which the light emission control signal em[1] is output with the high level, the pixels of the first pixel row of the display unit 10, when configured as a PMOS, respectively, receive the light emission control signal em[1], so they are not illuminated.

During the period PE20, the fourth control signal SPD delivered to the input signal terminal D1 of the second logic unit 103 has a high level, so the second logic unit 103 does not operate, and the phase of the fourth control signal SPD delivered to the input signal terminal D1 of the second logic unit 103 is changed from the high state to a low state at a time point t40. Then, a transistor G5 is turned on and the first power source voltage VGH is delivered to the node N40. Also, because the high potential voltage is applied to the node N40, the transistor G1 is turned off.

Thereafter, when the third clock signal clk1 is delivered with a low level to a transistor G6 at a time point t50, the transistor G6 is turned on to deliver the low level voltage to a node N30. A fifth capacitor C50 is charged With the voltage of the node 30 and the transistor G2 is turned on. Then, the pulse of the second output signal do[1] is generated correspondingly according to the voltage level of the pulse of the second clock signal clk2 delivered through the transistor G2. Thus, it is at the high state according to the voltage level of the pulse of the second clock signal clk2 at the time point t50, and when the phase of the second clock signal clk2 is changed to a low state at a time point t60, the second output signal do[1] is delivered with the low level starting from the time point t60.

Also, the second output signal do[1] is delivered in the low state to the input signal terminal D1 of the light emission control circuit of the next stage.

When the second output signal do[1] in the low state is delivered to the output controller 101 at the time point t60, the light emission control signal em[1] is output with a low level according to the process as described above with reference to FIG. 5.

During the period as long as the non-light emission period (i.e., the period PE20) starting from the time point t60, the light emission control signal em[1] is output with the low level by the voltage charged in the first capacitor C10 and the second capacitor C20. During the period in which the light emission control signal em[1] is output with the low level, the pixels of the first pixel row of the display unit 10, when configured as a PMOS, respectively, receive the light emission control signal em[1] so as to be illuminated.

The foregoing process is repeatedly performed, and the light emission control circuits of the stages following the first stage generate a plurality of light emission control signals shifted by one horizontal period (1H) and having the same light emission duty.

In the example embodiment of FIG. 9, the first start signal INT1 input to the first logic unit 102 and the second logic unit 103 is delivered with a low level pulse to turn on the transistors F4 and G4, respectively, to apply the second power source voltage VGL to the nodes N20 and N40. Then, the transistors F3, F30, and F1 and the transistors G3, G30, and G1 are turned on to apply the first power source voltage VGH to each of the nodes N10 and N30 to maintain the turn-off state of the transistors F2 and G2 and minimize a portion floated to the logic units.

The plurality of transistors constituting the light emission control circuit according to an example embodiment may be implemented in the form of only the PMOS transistors or only the NMOS transistors, and, accordingly, the polarity of the driving timing indicating the operation of the light emission control circuit may be changed.

As described above, embodiments relate to a light emission control driver, a light emitting display device using the same, and a method for driving a light emission control signal.

As display panels increase in size, screen quality of a sharp, high picture quality is needed. Further, a light emission control driver for controlling light emission of flat panel displays for providing sharp picture quality and implementing a threedimensional (3D) video display is needed, in line with the trend that 3D stereoscopic image displays are taking hold.

Accordingly, example embodiments are directed to providing a light emitting display device that may provide a high quality screen image, compensate for an IR drop according to video contents, and prevent the occurrence of a crosstalk phenomenon. An example embodiment provides a light emission control driver that can operate selectively and variably according to a screen driving scheme.

Example embodiments are also directed to providing a light emitting display device having a circuit structure of a light emission control driver applicable to a single MOS process of a PMOS transistor or an NMOS transistor. Therefore, the light emitting display device may be variously applied, such as being attached as an I/C to the exterior or being integrated in the interior of glass of the light emitting display device, so as to obtain the effect of reducing the size, weight, and unit cost.

An example embodiment is directed to a circuit structure of a light emission control driver applicable to both a sequential light emission driving scheme and a simultaneous light emission driving scheme, which may be implemented in an effort to reduce size, weight, and unit cost for a single MOS process of a PMOS transistor or NMOS transistor.

According to an example embodiment, by controlling the circuit configuration of the light emission control driver and the timing of the drive signals, the light emitting display device can be variably operated selectively according to the light emission driving schemes. Thus, the screen quality of the light emitting display device may be improved and the 3D stereoscopic image display may be advantageously implemented.

Also, the screen driving schemes of the light emitting display device may be quickly and easily changed. Accordingly, a defective screen image display may be improved and a crosstalk phenomenon in a 3D display may be prevented. Thus, the light emitting display device may be variously applied according to image display schemes of displays.

In addition, the circuit of the light emission control driver may be relatively simply configured. Accordingly, a layout area may be reduced, leading to a reduction in the weight, size, and unit cost of the light emitting display device. Therefore, an economical and reliable product in terms of production cost may be provided.

DESCRIPTION OF SYMBOLS

| 10: Display unit | 20: scan driver |
|---|---|
| 30: data driver | 40: light emission control driver |
| 50: timing controller | 60: pixel |
| 100: light emission control circuit | 101: output controller |
| 102: first logic unit | 103: second logic unit |

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present invention as set forth in the following claims. Also, the material of each element described in the disclosure of the present invention may be selected from the various known materials by the skilled person in the art. Also, the skilled person in the art may omit a portion of the elements described in the disclosure of the present invention without degrading performance or may add an element in order to improve performance. In addition, the skilled person in the art may change the order of the processes of the method described in the disclosure of the present invention according to a process environment or equipment. Therefore, the scope of the present invention should be determined by the appended claims and their equivalents, rather than by the described embodiments.

What is claimed is:

1. A light emission control driver, comprising:
   a first logic unit configured to receive a plurality of clock signals and a first input signal and generate a first output signal;
   a second logic unit configured to receive the plurality of clock signals and a second input signal and generate a second output signal; and
   an output controller configured to receive the first output signal, the second output signal, a first control signal, and a second control signal, and generate a light emission control signal, wherein:
   when a driving scheme of a display unit is a simultaneous light emission mode, the light emission control signal is controlled according to driving of the output controller, and
   when the driving scheme of the display unit is a progressive light emission mode, the light emission control signal is controlled according to driving of the first logic unit, the second logic unit, and the output controller.

2. The driver as claimed in claim 1, wherein, when the driving scheme of the display unit is the simultaneous light emission mode, the first input signal and the second input signal are delivered with a gate OFF voltage level, respectively, so the first and second logic units do not operate.

3. The driver as claimed in claim 1, wherein when the driving scheme of the display unit is the simultaneous light emission mode, a pulse width of the light emission control signal is determined by a time difference between time points at which the first control signal and the second control signal are delivered with the pulse of a gate ON voltage level, respectively.

4. The driver as claimed in claim 3, wherein the pulse width of the light emission control signal is equal to a light emission period or a non-light emission period of the display unit.

5. The driver as claimed in claim 3, wherein a delivery time of the pulse of the gate ON voltage level of the first control signal is the same as, or more than at least one horizontal period (1H) later than, a delivery time of the pulse of the gate OFF voltage level of the second control signal.

6. The driver as claimed in claim 3, wherein a delivery time of a pulse of a gate OFF voltage level of the first control signal is the same as, or more than at least one horizontal period (1H) earlier than, a delivery time of the pulse of the gate ON voltage level of the second control signal.

7. The driver as claimed in claim 3, wherein a duration of time in which the voltage levels of the first and second control signals change is more than at least one horizontal period (1H).

8. The driver as claimed in claim 1, wherein, when the driving scheme of the display unit is the progressive light emission mode, a pulse width of the light emission signal is determined by a time difference between a time point at which the first input signal is delivered with a pulse of a gate ON voltage level to the first logic unit and a time point at which the second input signal is delivered with the pulse of the gate ON voltage level to the second logic unit.

9. The driver as claimed in claim 8, wherein the pulse width of the light emission control signal is equal to a light emission period or a non-light emission period of the display unit.

10. The driver as claimed in claim 8, wherein:
a time point at which a phase of the light emission signal is changed to a gate OFF voltage level is synchronized with a time point at which a low level pulse of a clock signal is delivered to the first logic unit when the first input signal is delivered with the pulse of the gate ON voltage level, and
a time point at which the phase of the light emission signal is changed to a gate ON voltage level is synchronized with a time point at which a low level pulse of a clock signal is delivered to the second logic unit when the second input signal is delivered with the pulse of the gate ON voltage level.

11. The driver as claimed in claim 1, wherein the first logic unit comprises:
a first switch, a switching operation of which is controlled by a first clock signal among the plurality of clock signals, the first switch delivering a voltage according to the voltage level of the first input signal to a first node;
a second switch, a switching operation of which is controlled by the first input signal, the second switch delivering a first power source voltage to a second node;
a third switch, a switching operation of which is controlled corresponding to the voltage that has been delivered to the first node, the third switch delivering a voltage according to a voltage level of a second clock signal among the plurality of signals, with the voltage level of the first output signal;
a fourth switch, a switching operation of which is controlled corresponding to the voltage that has been delivered to the second node, the fourth switch delivering the first power source voltage with the voltage level of the first output signal;
a first capacitor storing the voltage that has been delivered to the first node; and
a second capacitor storing the voltage that has been delivered to the second node.

12. The driver as claimed in claim 11, wherein the first logic unit further comprises:
a fifth switch, a switching operation of which is controlled by a third clock signal among the plurality of clock signals, the fifth switch delivering a second power source voltage having a lower level than that of the first power source voltage to the second node; and
at least one sixth switch, a switching operation of which is controlled by the second power source voltage that has been delivered to the second node, the at least one sixth switch delivering the first power source voltage to the first node.

13. The driver as claimed in claim 1, wherein the second logic comprises:
a seventh switch, a switching operation of which is controlled by a third clock signal among the plurality of clock signals, the seventh switch delivering a voltage according to the voltage level of the second input signal to a third node;
an eighth switch, a switching operation of which is controlled by the second input signal, the eighth switch delivering a first power source voltage to a fourth node;
a ninth switch, a switching operation of which is controlled corresponding to the voltage that has been delivered to the third node, the ninth switch delivering a voltage according to a voltage level of the first clock signal among the plurality of clock signals, with the voltage level of the second output signal;
a tenth switch, a switching operation of which is controlled corresponding to the voltage that has been delivered to the fourth node, the tenth switch delivering the first power source voltage with the voltage level of the second output signal;
a third capacitor storing the voltage that has been delivered to the third node; and
a fourth capacitor storing the voltage that has been delivered to the fourth node.

14. The driver as claimed in claim 13, wherein the second logic unit further comprises:
at least one eleventh switch, a switching operation of which is controlled by the second clock signal among the plurality of clock signals, the at least one eleventh switch delivering a second power source voltage having a lower level than that of the first power source voltage to the fourth node; and
at least one twelfth switch, a switching operation of which is controlled by the second power source voltage that has been delivered to the fourth node, the at least one twelfth switch delivering the first power source voltage to the third node.

15. The driver as claimed in claim 1, wherein the output controller comprises:
at least one thirteenth switch, a switching operation of which is controlled by the first output signal, the at least one thirteenth switch delivering the first power source voltage to a fifth node;
at least one fourteenth switch, a switching operation of which is controlled by the first output signal, the at least one fourteenth switch delivering a second power source voltage having a lower level than that of the first power source voltage to a sixth node;
at least one fifteenth switch, a switching operation of which is controlled by the second output signal, the at least one fifteenth switch delivering the second power source voltage to the fifth node;
at least one sixteenth switch, a switching operation of which is controlled by the first control signal, the at least one sixteenth switch delivering the first power source voltage to the fifth node;
at least one seventeenth switch, a switching operation of which is controlled by the first control signal, the at least one seventeenth switch delivering the second power source voltage to the sixth node;
at least one eighteenth switch, a switching operation of which is controlled by the second control signal, the at least one eighteenth switch delivering the first power source voltage to the sixth node;
at least one nineteenth switch, a switching operation of which is controlled by the second control signal, the at least one nineteenth switch delivering the second power source voltage to the fifth node;
a twentieth switch, a switching operation of which is controlled by the voltage that has been delivered to the fifth node, the twentieth switch delivering the first power source voltage to the sixth node;
a twenty-first switch, a switching operation of which is controlled by the voltage that has been delivered to the sixth node, the twenty-first switch delivering the first power source voltage with a voltage level of the light emission control signal;
a twenty-second switch, a switching operation of which is controlled by the voltage that has been delivered to the fifth node, the twenty-second switch delivering the second power source voltage with the voltage level of the light emission control signal;
a fifth capacitor storing the voltage that has been delivered to the fifth node; and
a sixth capacitor storing the voltage that has been delivered to the sixth node.

16. The driver as claimed in claim 1, wherein the first logic unit and second logic unit further receive a start signal.

17. The driver as claimed in claim 1, wherein circuit elements constituting the first logic unit, the second logic unit, and the output controller include a plurality of transistors, and the plurality of transistors is implemented as only PMOS transistors or only NMOS transistors.

18. A light emitting display device, comprising:
a display unit including a plurality of pixels connected to a plurality of scan lines delivering a plurality of scan signals, a plurality of data lines delivering a plurality of data signals, and a plurality of light emission control lines delivering a plurality of light emission control signals;
a scan driver generating a scan signal and delivering the generated scan signal to a corresponding scan line among the plurality of scan lines;
a data driver delivering data signals to the plurality of data lines; and
a light emission control driver generating a light emission control signal and delivering the generated light emission control signal to a corresponding light emission control line among the plurality of light emission control lines, wherein:
the light emission control driver includes:
a first logic unit configured to receive a plurality of clock signals and a first input signal and generate a first output signal;
a second logic unit configured to receive the plurality of clock signals and a second input signal and generate a second output signal; and
an output controller configured to receive the first output signal, the second output signal, a first control signal, and a second control signal, and generate the light emission control signal,
when a driving scheme of the display unit is a simultaneous light emission mode, the light emission control signal is controlled according to driving of the output controller, and
when the driving scheme of the display unit is a progressive light emission mode, the light emission control signal is controlled according to driving of the first logic unit, the second logic unit, and the output controller.

19. The device as claimed in claim 18, wherein, when the driving scheme of the display unit is the simultaneous light emission mode, the first input signal and the second input signal are delivered with a gate OFF voltage level, respectively, so the first and second logic units do not operate.

20. The device as claimed in claim 18, wherein, when the driving scheme of the display unit is the simultaneous light emission mode, a pulse width of the light emission control signal is determined by a time difference between time points at which the first control signal and the second control signal are delivered with the pulse of a gate ON voltage level, respectively.

21. The device as claimed in claim 20, wherein the pulse width of the light emission control signal is equal to a light emission period or a non-light emission period of the display unit.

22. The device as claimed in claim 20, wherein a delivery time of the pulse of the gate ON voltage level of the first control signal is the same as, or more than at least one horizontal period (1H) later than, a delivery time of the pulse of the gate OFF voltage level of the second control signal.

23. The device as claimed in claim 20, wherein a delivery time of a pulse of a gate OFF voltage level of the first control signal is the same as, or more than at least one horizontal period (1H) earlier than, a delivery time of the pulse of the gate ON voltage level of the second control signal.

24. The device as claimed in claim 20, wherein a duration of time in which the voltage levels of the first and second control signals change is more than at least one horizontal period (1H).

25. The device as claimed in claim 18, wherein, when the driving scheme of the display unit is the progressive light emission mode, a pulse width of the light emission signal is determined by a time difference between a time point at which the first input signal is delivered with a pulse of a gate ON voltage level to the first logic unit and a time point at which the second input signal is delivered with the pulse of the gate ON voltage level to the second logic unit.

26. The device as claimed in claim 25, wherein the pulse width of the light emission control signal is equal to a light emission period or a non-light emission period of the display unit.

27. The device as claimed in claim 25, wherein:
a time point at which the phase of the light emission signal is changed to a gate OFF voltage level is synchronized with a time point at which a low level pulse of a clock signal is delivered to the first logic unit when the first input signal is delivered with the pulse of the gate ON voltage level, and
a time point at which the phase of the light emission signal is changed to the gate ON voltage level is synchronized with a time point at which a low level pulse of a clock signal is delivered to the second logic unit when the second input signal is delivered with the pulse of the gate ON voltage level.

28. The device as claimed in claim 18, wherein the light emission control driver comprises a plurality of light emission control circuits each including the first logic unit, the second logic unit, and the output controller, and each of the light emission control circuit generates an output signal and delivers the generated output signal to each of the plurality of light emission control lines.

29. The device as claimed in claim 28, wherein the first input signal and second input signal delivered to a light emission control circuit positioned at a predetermined stage among the plurality of light emission control circuits are the first output signal and second output signal output from a light emission control circuit positioned at a stage previous to the predetermined stage.

30. The device as claimed in claim 28, wherein:
the first logic unit and second logic unit include three clock signal terminals, to each of which a clock signal selected from among three clock signals is input, and
a delivery pattern of the three clock signals delivered to the three clock signal terminals of each of the plurality of light emission control circuits is repeated at every three light emission control circuits sequentially positioned at the plurality of light emission control circuits.

31. A method for driving a light emission control signal of a light emission control driver that includes a first logic unit configured to receive a plurality of clock signals and a first input signal and generate a first output signal, a second logic unit configured to receive a plurality of clock signals and a second input signal and generate a second output signal, and an output controller configured to receive the first output signal, the second output signal, a first control signal, and a second control signal, and generate a plurality of light emission control signals to be delivered to a plurality of light emission control lines connected to a plurality of pixel rows of a display unit, the method comprising:

delivering the first input signal and second input signal with a gate OFF voltage level and delivering the plurality of clock signals with a gate ON voltage level so as to turn off the first logic unit and second logic unit; and delivering the first control signal with the a ON voltage level while the first logic unit and second logic unit are in an OFF state, and simultaneously outputting the plurality of light emission control signals with a gate OFF voltage level during a first period between a first time point at which the first control signal is delivered with the gate ON voltage level and the second control signal is delivered with a gate OFF voltage level, and a second time point at which the first control signal is delivered with a gate OFF voltage level and the second control signal is delivered with a gate ON voltage level.

32. The method as claimed in claim 31, wherein, in a case where the first control signal is delivered with the gate ON voltage level after the second control signal is delivered with the gate OFF voltage level, the first time point is the delivery time point of the first control signal.

33. The method as claimed in claim 31, wherein, in a case where the second control signal is delivered with the gate ON voltage level after the first control signal is delivered with the gate OFF voltage level, the second time point is the delivery time point of the second control signal.

34. The method as claimed in claim 31, further comprising, while the first and second logic units are in an ON state as the first input signal and second input signal have been delivered with a gate ON voltage level, outputting one of the plurality of light emission control signals with the gate OFF voltage level during a second period between a third time point at which the first input signal is delivered with a gate ON voltage level and a first clock signal among the plurality of clock signals is delivered with the gate ON voltage level, and a fourth time point at which the second input signal is delivered with the gate ON voltage level and a second clock signal among the plurality of clock signals is delivered with the gate ON voltage level, wherein each of the plurality of light emission control signals with the gate OFF voltage level during the second period progressively shifts by more than at least one horizontal period.

35. The method as claimed in claim 34, wherein the first control signal and second control signal delivered to the output controller while the first logic unit and second logic unit are in an ON state have the gate OFF voltage level.

36. The method as claimed in claim 34, wherein, when a circuit element constituting the light emitting display device is a PMOS transistor, the gate ON voltage is a low level voltage and the gate OFF voltage is a high level voltage.

* * * * *